United States Patent [19]

Kollaritsch

[11] 4,433,331
[45] Feb. 21, 1984

[54] PROGRAMMABLE LOGIC ARRAY INTERCONNECTION MATRIX

[75] Inventor: Paul W. Kollaritsch, Hazlet, N.J.

[73] Assignee: Bell Telephone Laboratories, Incorporated, Murray Hill, N.J.

[21] Appl. No.: 330,222

[22] Filed: Dec. 14, 1981

[51] Int. Cl.³ .................. H04Q 9/00; H03K 19/20
[52] U.S. Cl. ......................... 340/825.83; 307/465; 364/716
[58] Field of Search .............. 340/825.83; 364/716; 307/465

[56] References Cited

U.S. PATENT DOCUMENTS 3,816,725 6/1974 Greer .
3,936,812 2/1976 Cox et al. .
3,987,287 10/1976 Cox et al. .
4,124,899 11/1978 Birkner ............................ 307/465

OTHER PUBLICATIONS

"Electrical Alterable Programmable Logic Array", Y. N. Hsieh et al., *International Electron Devices Meeting*, 12-1980, pp. 598-601.

*Primary Examiner*—Donald J. Yusko
*Attorney, Agent, or Firm*—John A. Caccuro

[57] ABSTRACT

An interconnection matrix is disclosed for connecting inputs and outputs of logic circuit of a programmable logic array (PLA). The interconnection matrix consists of row conductors each connected to an input of a logic circuit and segments of column conductors each connected to an output of a logic circuit. By limiting the interconnection capability of each column conductor several column conductors each electrically isolated from each other can share the same column of the interconnection matrix. The resulting PLA can perform various logic functions using an interconnection matrix which does not grow geometrically with an increase in the number of logic circuits.

16 Claims, 6 Drawing Figures

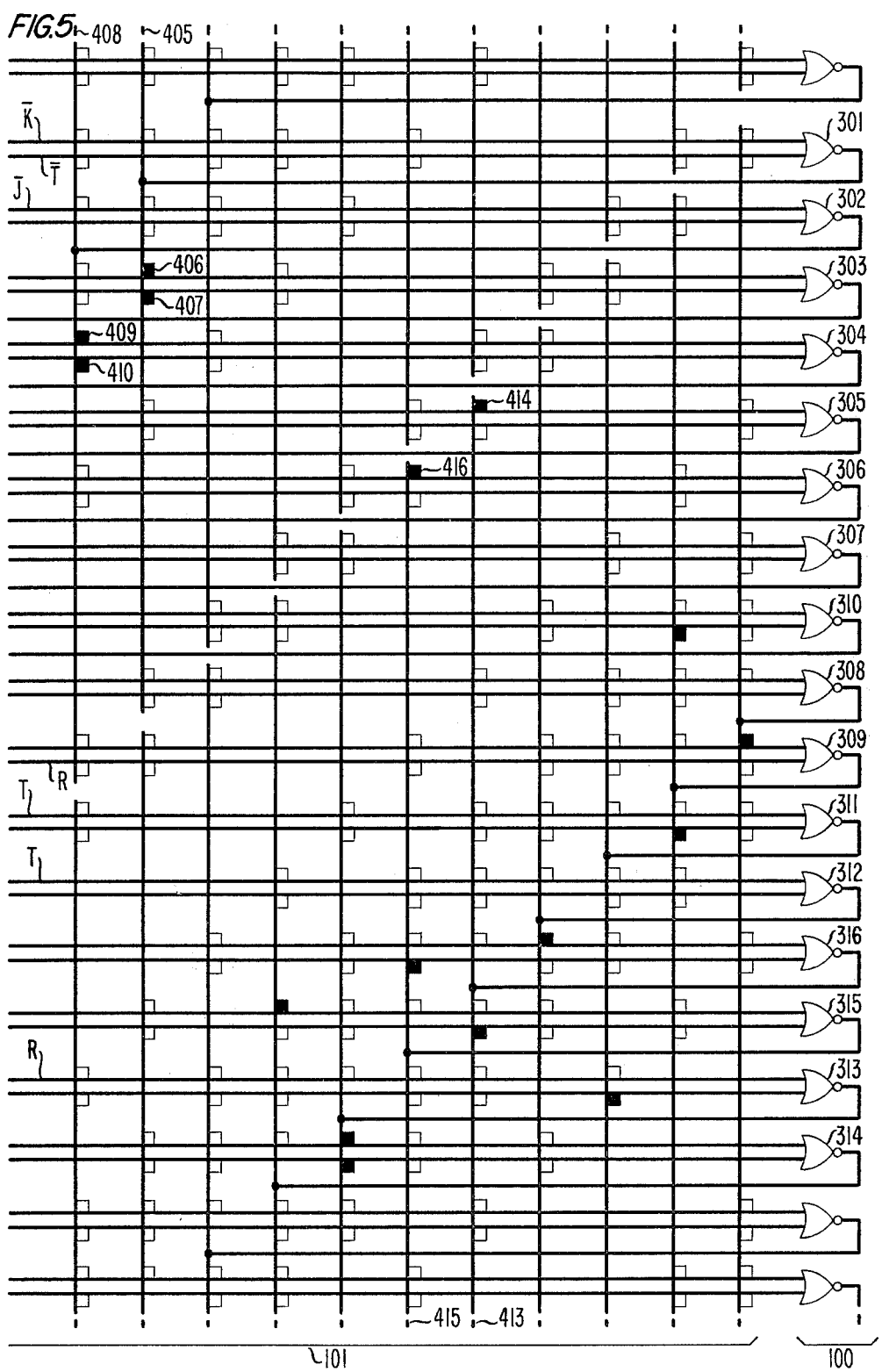

PROGRAMMABLE LOGIC ARRAY INTERCONNECTION MATRIX

FIELD OF THE INVENTION

This invention relates to an interconnection matrix of programmable logic arrays and more particularly to increasing the number of logic functions performed by the array without increasing the size of the array.

BACKGROUND OF THE INVENTION

Logic circuit design engineers continue to seek a universal integrated logic circuit design which would greatly reduce the requirement of using many different types of integrated logic circuits to implement logic functions. The ideal universal integrated logic circuit would fulfill this requirement by providing in one integrated circuit device the capability of generating any arbitrary Boolean logic function in factored or unfactored form having a single or multiplicity of outputs which can operate in combinational, sequential, or asynchronous modes.

One well-known universal integrated logic circuit arrangement called a programmable logic array (PLA) consists of one or more arrays of logic circuits having inputs and outputs which are interconnected via a mask or an electrical programmable interconnection matrix. The interconnection matrix is essentially rectangular in shape with all columns and row conductors extending the full height and width of the matrix. The number of columns and rows of the interconnection matrix is determined by the number of logic circuit elements on the PLA. Undesirably, in the larger PLAs the interconnection matrix occupies a larger percentage of the area of the PLA. Moreover, in these large PLAs only a smaller percentage of the interconnection matrix is utilized for the actual logic circuit interconnections. This increasingly inefficient utilization of the interconnection matrix in large PLAs results in a larger cost per logic circuit function.

Prior art techniques for increasing the efficient use of the interconnection matrix include splitting the rows and column lines of the interconnection matrix so that separate logic functions can be performed on the signals present on each end of the split lines.

U. S. Pat. No. 3,987,287 issued on Oct. 19, 1976 to D. T. Cox et al and U. S. Pat. No. 3,816,725 issued on June 11, 1974 to D. L. Greer are representative of such a technique. Despite the improvements resulting from the use of the above technique there is a continuing need to more efficiently utilize the interconnection matrix of a PLA.

SUMMARY OF THE INVENTION

In accordance with the present invention, the size of the interconnection matrix for a given PLA size is minimized by limiting the access of the output of each logic circuit to the inputs of a unique group of adjacent logic circuit of the logic array.

The present invention recognizes that the interconnection matrix required to implement typical logic functions usually only requires access to a limited number of input variables, a limited number of feedback interconnections to previously connected logic circuits, and a limited number of feedforward interconnections to additional logic circuits. By limiting the possible input, feedback and feedforward interconnection capability of each logic circuit, the associated column conductor lines of the interconnection matrix are of limited length, enabling several isolated column conductors to share the same column of the matrix. Moreover, each logic circuit is arranged to have programmable access to a unique predetermined limited number of adjacent logic circuits. The result is a PLA in which the logic circuits can be programmed to provide either separate logic functions or which can be programmed to be interconnected in a serial like manner. Additionally, this results in a PLA in which the interconnection matrix does not grow geometrically with an increase in the number of logic circuits. Finally, the resulting PLA has both a more efficiently utilized minimal interconnection matrix and greater logic circuit density without significantly limiting the capability to implement various combinatorial, sequential and asynchronous logic functions.

BRIEF DESCRIPTION OF THE DRAWING

The detailed description of the invention will be more fully appreciated from the illustrative embodiment shown in the drawings, in which:

FIGS. 4 and 5 show the interconnection required to implement a J-K flip-flop logic function in accordance with the invention;

DETAILED DESCRIPTION

Figure 1:
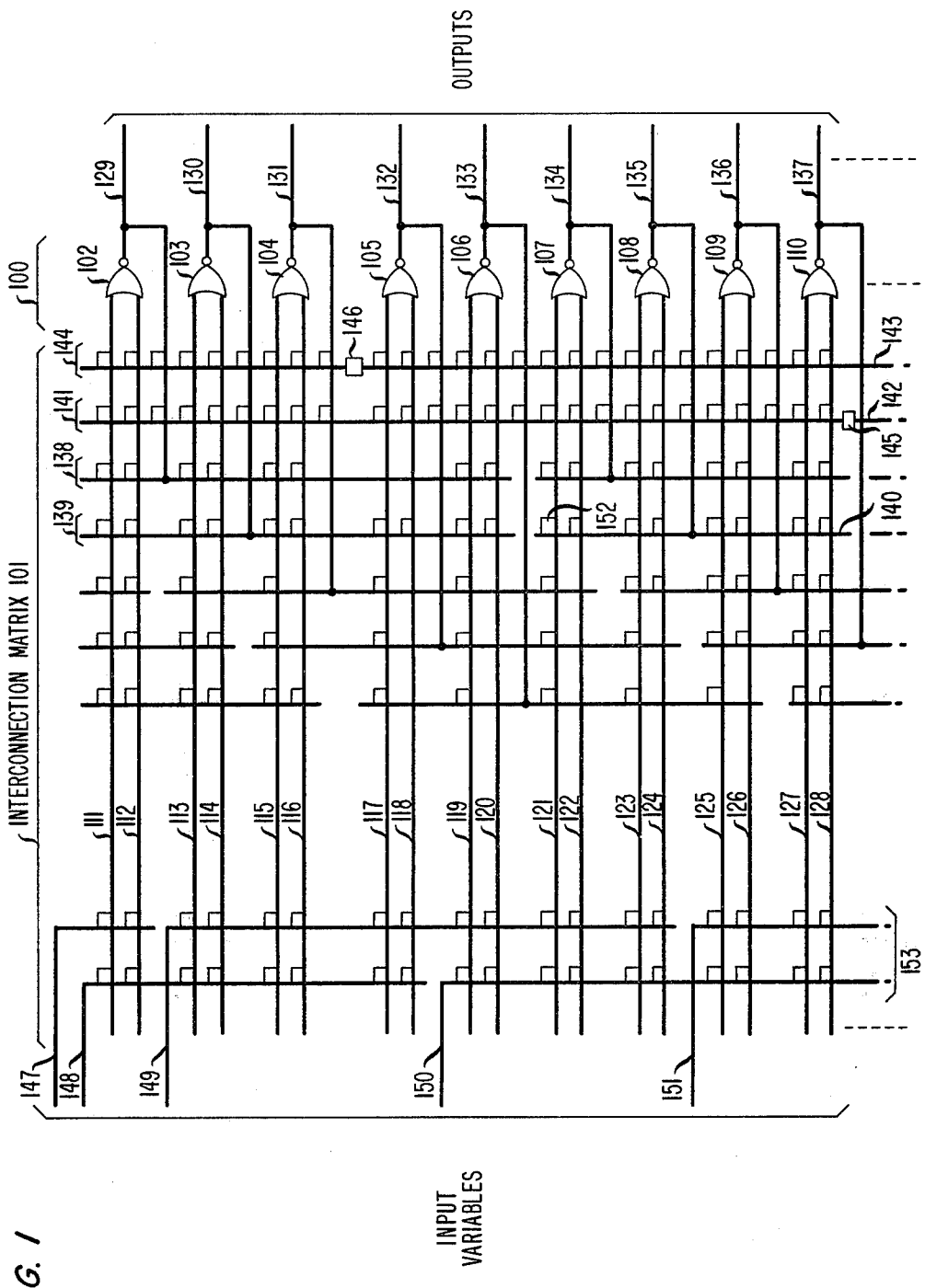
FIG. 1 shows a programmable logic array (PLA) incorporating the inventive interconnection matrix.

As can be seen from FIG. 1 of the drawings, a PLA is shown having a column array 100 of two input NOR logic circuits (gates) 102 through 110 having input conductors 111 through 128 and output conductors 129 through 137, respectively, connected to interconnect matrix 101. Inputs 147 through 151 also connect to interconnect matrix 101. As illustrated, these inputs only intersect the input conductors of a predetermined number of NOR gates. While not shown in FIG. 1, these inputs 147 through 151 connect to an input matrix to provide programmable connection to the input leads of the PLA chip. The output conductor of each NOR gate intersects both its own inputs and the inputs of a predetermined number of NOR gates located above or below. The appropriate output conductors of the NOR gates are connected through an output matrix, not shown, to provide programmable connection to the output leads of the PLA chip.

As noted, the interconnection matrix 101 is arranged to give each logic circuit (gate) access to a limited number of input variables (147–151), a limited number of feedback interconnections to preceeding logic circuits, and a limited number of feedforward interconnections to following logic circuits in the logic circuit array. As will be discussed in a later paragraph, programmable cross points, shown as box symbol 152, located at the intersection of the input and output conductors provide a selectively enabled electrical connection between these conductors. While the logic circuit array 100 of FIG. 1 utilizes two input NOR logic gates it is to be understood that the disclosed invention can be utilized with other logic circuits such as inverters, multiple input AND, OR, NOR or NAND gates, memory elements (flip-flops), etc. or electrically programmable combinations thereof arranged as logic array 100. For example, the inputs to the NOR logic gates can include an inverter which can be programmed to provide a signal or its complement to the NOR logic gates.

Moreover, interconnection matrix 101 can be utilized without logic circuit array 100 to provide an interconnect function between input conductors (leads) 111 through 128 and output conductors 129 through 137. Such an interconnection matrix is constructed by arranging a plurality of electrically isolated rows and columns of electrical conductors with programmable cross points at the respective intersections. The column conductors of the matrix are grouped into groups consisting of one or more column conductors. Each column conductor of each group is segmented into two or more electrically isolated colinear column segments such that the column segments of different groups have programmable cross points to a unique group of row conductors. The number and arrangements of interconnections possible with such a matrix are as varied as those of interconnection matrix 101 of the PLA of FIG. 1 which will be described hereinafter.

Interconnect matrix 101 is shown having the logic circuit input conductors as row conductors and the logic circuit output conductors as column conductors. While the row conductors and column conductors are shown as being substantially orthogonally disposed with respect to each other, any intersecting layout of row and column conductors is contemplated. Each column of the matrix is comprised of two or more colinear column conductors which are isolated from each other and each of which connect to the output conductor of a different logic circuit. The use of a segmented column conductor enables each column of the interconnection matrix to be shared by a number of different output column conductors. Thus, for example, columns 139 and 140 of the interconnection matrix is shared by output conductor 130 of logic circuit 103 and output conductor 135 of logic circuit 108, respectively. While the output conductor 130 of NOR gate 103 has a limited connection range it does provide feedback intersections to its own input paths 113 and 114, feedback intersections to input paths 111 and 112 of an adjacent NOR gate 102 and feedforward intersections to input paths 115, 116, 117, 118, 119 and 120, respectively, of NOR gates 104, 105 and 106. The number of feedback gates (102) and feedforward gates (104, 105 and 106) intersected by the output conductor bus 130 of NOR gate 103 is determined by the user according to the type of logic functions to be implemented. While logic circuits 103, 104, 105 and 106 of FIG. 1 are shown using a segmented column conductor which enables feedback to a prior adjacent gate and feedforward to three additional adjacent gates it should be recognized that the number of gates to which feedback and feedforward is provided can be determined according to the logic functions desired to be implemented by the PLA. Additionally, it should be noted that the number of gates to which feedback and feedforward are provided need not remain constant over the whole interconnection matrix 101. For example, as shown in FIG. 1 the output conductor 135 of gate 108 provides feedback to gate 107 and feedforward only to two gates 109 and 110. Moreover, it may be desirable to have the output conductors of a group of adjacent gates have connectability to the same group of input conductors as shown, for example, by gates 107 and 108 which both have connectability to input conductors 121 through 128.

The term connectability as used herein means that an electrical connection can be made at an intersection if the cross point is mask or electrically programmed for a connection. The programmable cross points are illustrated in FIG. 1 by a square or box occurring at the intersection of two conductors as shown by, for example, cross point 152 at the intersection of input conductor 121 and output conductor 135 of gate 108. The programmable cross point can be implemented, illustratively, either as a connection made during a mask programming step of the PLAs manufacture, as an electrically programmable memory cell (which can be programmed by the user), or by some other programming means.

It is to be noted that while the column conductors of gates 102 and 103 have intersections with the same group of input conductors 111 through 120 they do not have connectability with the same input conductors. As illustrated, output conductor 129 of gate 102 does not have connectability, i.e. cross points, with input conductors 117 and 118 as does output conductor 130 of gate 103. Thus, while the disclosed invention teaches a prearranged interconnection matrix having a limited feedback and feedforward interconnection capability, as discussed above, the interconnection matrix can be implemented in a wide variety of formats without deviating from the teaching of the invention. Hence, it is contemplated that each segment of an output column may or may not have intersection with the same number of row conductors, may or may not have cross points at each intersection with a row conductor, and may or may not have the same number or distribution of cross points.

In another aspect of the invention, interconnection conductors 141 through 144 provide for connectability, via cross points, between various input and output conductors. These interconnection conductors provide access to gates which are beyond the limited feedback and feedforward range of the local gates. Hence, when implementing a certain logic function if an input or output signal is required which is not within the limited range of gates which are being utilized to implement the logic function then an interconnection conductor can be utilized for access to the remote gate or signal. As shown in FIG. 1, interconnect conductors 141 and 142 have limited range, but can be interconnected by a programmable bridging cross point 145 to provide access to even more remote gates or signals. Obviously, when not programmed cross point 145 isolates interconnect conductors 141 and 142. Similarly, interconnect conductors 143 and 144 with bridging cross point 146 provide an additional route to access remote gates or signals. The number and length of interconnection conductors (141–144) can be selected according to the logic functions to be implemented and the feedback and feedforward range of the input and output conductors. Obviously, the cross points on interconnection conductors (141–144) can be programmed to provide electrical connection to any of the intersected group of inputs or outputs of the logic gates.

In another aspect of the invention, interconnection matrix 101 provides a submatrix 153 for providing connectability between input variable terminals 147 through 151 to input conductors 111 through 128. Thus, rather than have an input matrix (not shown) which provides all the input conductors (111–128) access to the actual input leads of the PLA chip (not shown), only a limited number of input variable terminals (147-151) are provided with such access. This results in a smaller input matrix, especially since each intersection in the input matrix is provided with a programmable cross point. As noted previously, the programmable cross point can be implemented as a mask programmable connection or more desirably as a electrically programmable memory cell.

Figure 2:
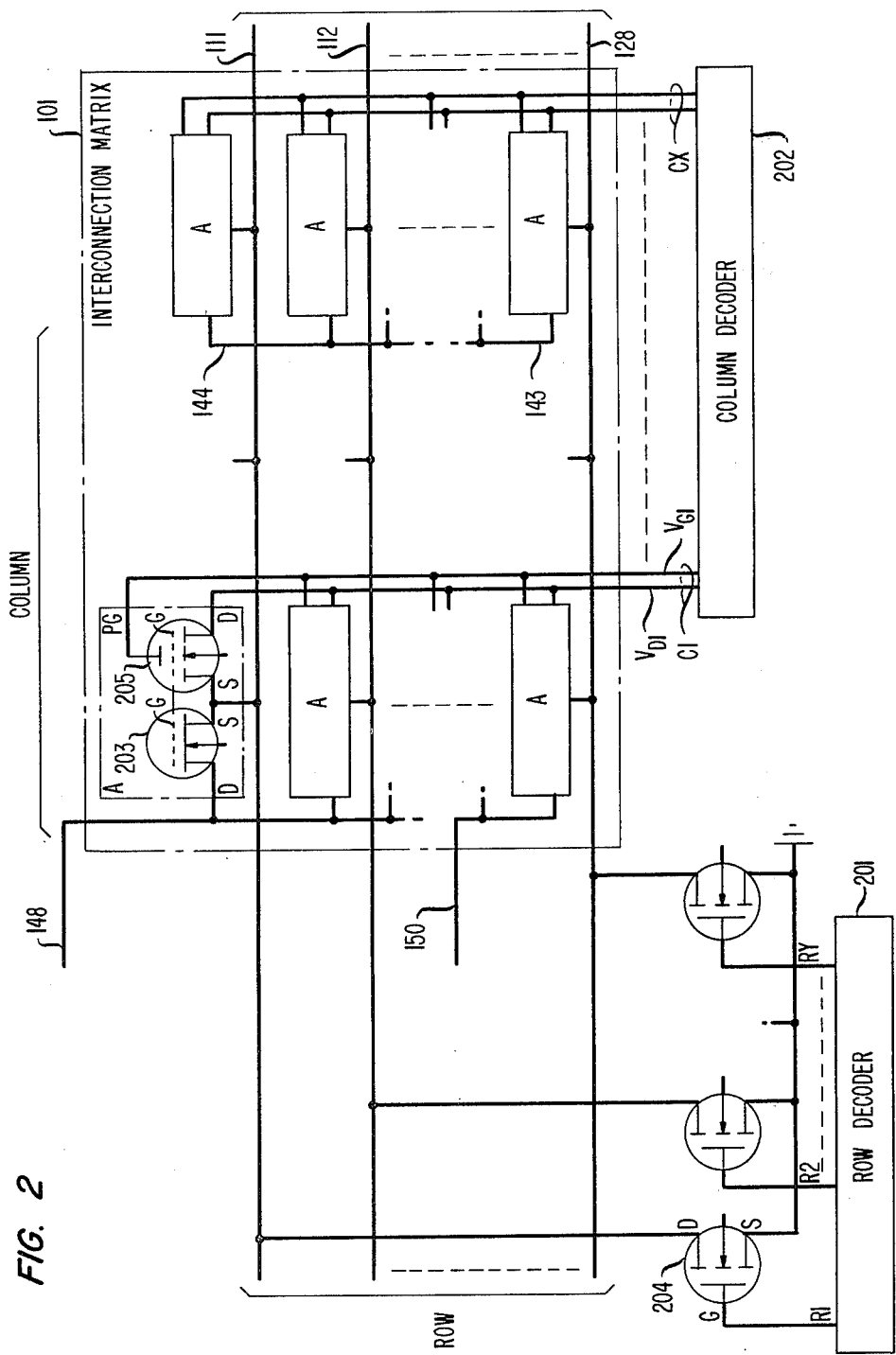
FIG. 2 shows an individual cross point utilized in the interconnection matrix.

Electrically programmable memory cells can be implemented as a fuse-linked cross point, an ultraviolet erasable cross point, or an electrically erasable (reprogrammable) cross point. FIG. 2 illustrates the preferred embodiment of an electrically reprogrammable memory cell which is located at each cross point of the interconnect matrix 101. The basic operation of such an electrically reprogrammable memory cell is described in a paper entitled "Electrically Alterable Programmable Logic Array (EAPLA)", written by Y. N. Hsieh et al, pp. 598-601, December 1980, International Electron Devices Meeting which is incorporated by reference herein.

In FIG. 2, the cross points which exist at the intersection formed by row conductors 111 through 128 and the column conductors of FIG. 1 are designated as A. Row decoder 201 and column decoder 202 select, respectively, the row and column coordinate of the cross point to be programmed. Assuming that the cross point at column 148 and row 111 is to be electrically programmed, row lead R1 would be at a positive voltage and column leads VD1 and VG1 of cable C1 would be at a positive voltage. The positive voltage on lead R1 causes the NMOS transistor 204 to conduct placing a ground potential on the drain D terminal of transistor 204.

Memory cell A, basically as described in the Hsieh article, consists of two transistors (203 and 205) sharing a floating gate implemented in double polysilicon MOS technology. The ground potential of transistor 204 pulls the source S of NMOS transistors 203 and 205 to a ground potential. User programming of memory cell A is accomplished by the application of a positive voltage VG1 to the programming gate PG of device 205 and a positive voltage VD1 to the drain D of device 205. The memory cell A is erased by application of a predetermined negative voltage, on lead VG1, to programming gate PG of device 205. Once programmed, floating gate G of device 205 biases the gate G of device 203 to maintain a high impedance, virtual electrical isolation, between the source S and drain D of device 203. Hence, row 111 would be electrically isolated through the drain D and source S of device 203 from column 48. While the particular cross point embodiment is implemented in double polysilicon MOS technology other implementations are contemplated which would not deviate from the scope of the invention as disclosed.

Figure 3:
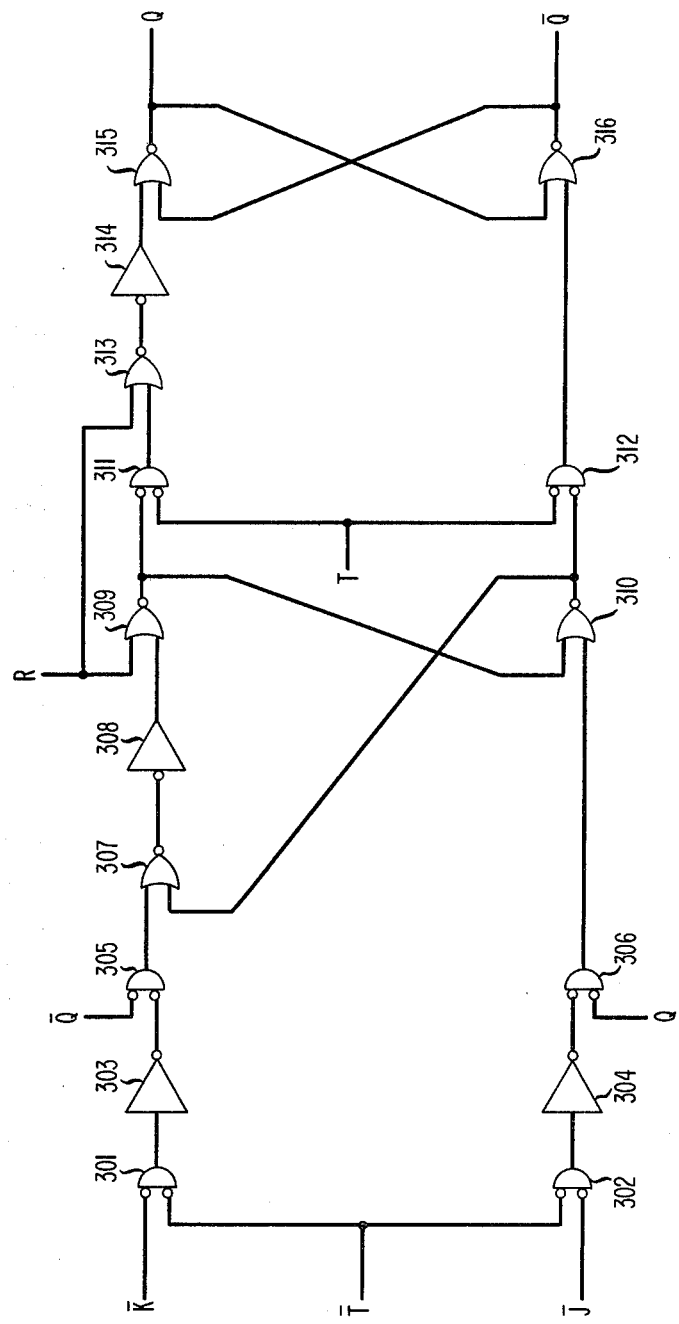
FIG. 3 shows a logic circuit diagram of a conventional J-K flip-flop which are included as an aid in understanding FIGS. 4 and 5.
Figure 4:
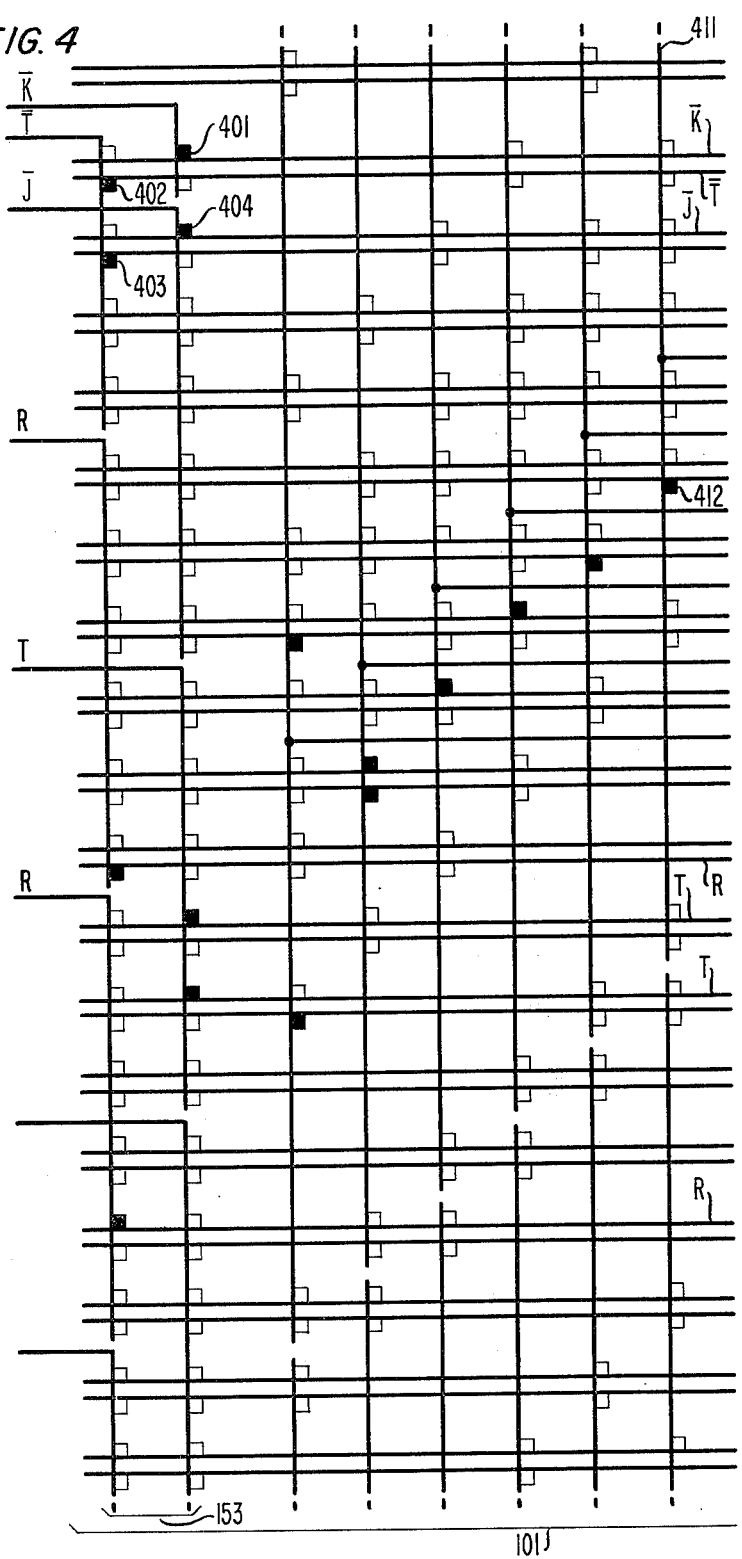
Figure 6:
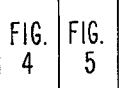
FIG. 6 shows the association of FIGS. 4 and 5.

FIG. 3 and FIGS. 4 through 6 illustrate the use of the disclosed invention to implement a prior art typical J-K flip-flop. Since, illustratively, the disclosed invention utilizes 2-input NOR gates in the logic array, the J-K flip-flop is implemented in FIG. 3 using 2-input NOR gates. The gates utilized to implement the J-K flip-flop are designated as gates 301 through 316 in both FIG. 3 and FIGS. 4 and 5. The input and output leads are likewise similarly designated in FIGS. 3, 4 and 5. In FIGS. 4 and 5 the programmable cross points (memory cells A of FIG. 2) are illustrated by a box at the appropriate intersection of row and column conductors. Illustratively, the box is black when a programmable cross point is programmed to provide an electrical connection. A white box indicates that a programmable cross point provides no electrical connection between the row and column conductors. The implementation of the J-K flip-flop of FIG. 3 using a PLA including the disclosed programmable interconnection matrix and a column array of 2-input NOR gates is shown in FIGS. 4 and 5. As is well known in the art a positive signal input NOR gate is equivalent to a negative signal input NAND gate. Hence, gate 301 of FIG. 3 is equivalent to gate 301 of FIG. 5.

Inputs $\overline{K}$, $\overline{J}$, R, T of FIG. 3 are likewise inputs to the PLA of FIG. 4. Note that input R requires two separate inputs to submatrix 153 to gain access to NOR gates 309 and 313. This results from the particular implementation illustrated in FIG. 4 and the limited crossconnection range selected for submatrix 153.

The following discussion makes joint reference to FIG. 3 and FIGS. 4 and 5. Input $\overline{K}$ connects to gate 301 (i.e. NOR gate 301) via cross point 401. The input $\overline{T}$ connects to gates 301 and 302 via cross points 402 and 403 respectively. Input $\overline{J}$ connects to gate 302 via cross point 404. The output of gate 301 connects to column conductor 405 and to inverter gate 303 via cross points 406 and 407. Note inverter gate 303 is implemented by tying of two inputs together via cross points 406 and 407. Similarly, the output of gate 302 connects to inverter gate 304 via column conductor 408 and cross points 409 and 410. The output of gate 303 connects to an input of gate 305 via column conductor 411 and cross point 412. The other input to gate 305 is provided from output $\overline{Q}$ of gate 316 via column conductor 413 and cross point 414. In a similar manner output Q of gate 315 connects to an input of gate 306 via column conductor 415 and cross point 416. The remaining connections shown on FIG. 3 are similarly implemented by the equivalently designated leads and gates of FIGS. 4 and 5 to fully implement the J-K flip-flop shown in FIG. 3. Note that the inter-connection matrix 101 and NOR gate array 100 can be extended in the vertical direction to provide the PLA with the capability to concurrently implement other logic functions.

The disclosed embodiments of my invention are merely illustrative. Other embodiments known to those skilled in the art would provide similar functions without deviating from the scope of my invention.

What is claimed is:

1. An electrical interconnection matrix comprising a plurality of substantially orthogonally disposed and electrically isolated rows and columns of electrical conductors including programmable cross points at intersections between the row and column conductors for enabling electrical connection therebetween characterized in that
said column conductors are arranged in groups, each of said column conductors comprising two or more electrically isolated colinear segments, the segments of different groups having programmable cross points to a unique group of row conductors.

2. The invention of claim 1 wherein some of said groups include one column conductor.

3. The invention of claim 1 wherein some segments which have intersection with the same group of row conductors have a unique group of programmable cross points to said group of row conductors.

4. The invention of claim 1 wherein some segments have intersections with row conductors without a cross point therebetween.

5. The invention of claim 1 wherein each segment has intersection with the same number of row conductors.

6. The invention of claim 5 wherein each segment has the same number of cross points.

7. The invention of claim 6 wherein each segment has a cross point at each intersection with a row conductor.

8. A logic performing arrangement comprising a plurality of logic circuits and programmable cross points, each logic circuit including an input and an output where the output of each logic circuit is selectively connectable to an input of other logic circuits of the plurality of logic circuits through separate programmable cross points
characterized in that
said logic circuits are arranged in multiple sets where each set includes one or more logic circuits with the output of each logic circuit of a set having identical selective connectability to the inputs of other logic circuits of a predetermined number of sets and wherein the outputs of logic circuits of different sets have selective connectability to different predetermined number of sets of said multiple sets.

9. The invention of claim 8 where the output of each logic circuit is selectively connectable to one of its own inputs.

10. The invention of claim 8 where the output of a first logic circuit is selectively connectable to an input of a second logic circuit having an output which is selectively connectable to an input of said first logic circuit.

11. The invention of claim 8 where the output of a logic circuit of each set is selectively connectable to the input of a logic circuit of an adjacent set.

12. The logic performing arrangement of claim 8 further comprising an input variable terminal selectively connectable through separate programmable cross points to logic circuits of a predetermined number of sets.

13. The invention of claim 8 where said logic circuits are multiple input logic gates.

14. The invention of claim 1 or 8 where said programmable cross points are electrically reprogrammable.

15. A method of constructing an electrical interconnection matrix by
orthogonally arranging a plurality of electrically isolated rows and columns of electrical conductors including programmable cross points at intersections between the row and column conductors,
said method further characterized by the steps of
grouping one or more column conductors together in groups, and
segmenting the column conductors of each group into two or more electrically isolated colinear segments with the segments of different groups having programmable cross points to a unique group of row conductors.

16. A method of constructing a logic performing arrangement comprising a plurality of logic circuits and programmable cross points by
interconnecting the inputs and outputs of the logic circuits using programmable cross points arranged in a rectangular matrix having electrically isolated row and column conductors for respectively connecting to each row and column of the cross points of the rectangular matrix,
said method further characterized by the steps of
grouping one or more column conductors together in groups, and
segmenting the column conductors of each group into two or more electrically isolated colinear segments with the segments of different groups having programmable cross points to a unique group of row conductors.

* * * * *